US010741551B2

(12) United States Patent
Torres

(10) Patent No.: US 10,741,551 B2
(45) Date of Patent: Aug. 11, 2020

(54) INTEGRATED VERTICAL AND LATERAL SEMICONDUCTOR DEVICES

(71) Applicant: General Electric Company, Schenectady, NY (US)

(72) Inventor: Victor Mario Torres, Clifton Park, NY (US)

(73) Assignee: GENERAL ELECTRIC COMPANY, Niskayuna, NY (US)

(*) Notice: Subject to any disclaimer, the term of this patent is extended or adjusted under 35 U.S.C. 154(b) by 0 days.

(21) Appl. No.: 16/235,263

(22) Filed: Dec. 28, 2018

(65) Prior Publication Data

US 2020/0212034 A1   Jul. 2, 2020

(51) Int. Cl.
| H01L 21/8234 | (2006.01) |
| H01L 27/088 | (2006.01) |
| H01L 21/82 | (2006.01) |
| H01L 21/761 | (2006.01) |
| H01L 21/8238 | (2006.01) |

(52) U.S. Cl.
CPC .......... *H01L 27/088* (2013.01); *H01L 21/761* (2013.01); *H01L 21/8213* (2013.01); *H01L 21/82345* (2013.01); *H01L 21/82385* (2013.01); *H01L 21/823412* (2013.01); *H01L 21/823487* (2013.01); *H01L 21/823493* (2013.01)

(58) Field of Classification Search
CPC .................... H01L 21/82345; H01L 21/82385
See application file for complete search history.

(56) References Cited

U.S. PATENT DOCUMENTS

| 5,818,282 A | 10/1998 | Sumida | |
| 6,628,493 B1 | 9/2003 | Chen et al. | |
| 7,309,896 B2 | 12/2007 | Kim | |
| 8,022,476 B2 | 9/2011 | Pang | |
| 2006/0220140 A1* | 10/2006 | Robb | H01L 21/823487 257/371 |
| 2007/0205431 A1* | 9/2007 | Robb | H01L 21/823487 257/119 |
| 2011/0006362 A1* | 1/2011 | Hsieh | H01L 29/1095 257/330 |
| 2012/0181581 A1* | 7/2012 | Hynecek | H01L 27/1464 257/222 |
| 2014/0008718 A1* | 1/2014 | Toyoda | H01L 21/823412 257/330 |
| 2014/0054585 A1 | 2/2014 | Ritenour | |
| 2019/0252269 A1* | 8/2019 | Toyoda | H01L 27/0922 |

OTHER PUBLICATIONS

International Search Report/Written Opinion; PCT/US2019/068608, dating Apr. 24, 2020; 13 pages.

* cited by examiner

*Primary Examiner* — David Vu
*Assistant Examiner* — Brandon C Fox
(74) *Attorney, Agent, or Firm* — Fletcher Yoder, P.C.

(57) ABSTRACT

An integrated circuit die that may have one vertical transistor and one horizontal transistor is disclosed. The transistors may have substantially different breakdown voltages. The vertical transistor may be used in power circuitry applications and the horizontal transistor may be used in logic circuitry applications.

20 Claims, 4 Drawing Sheets

INTEGRATED VERTICAL AND LATERAL SEMICONDUCTOR DEVICES

BACKGROUND

The subject matter disclosed herein relates to semiconductor devices and, more specifically, to integrated semiconductor dies having vertical and lateral devices.

This section is intended to introduce the reader to certain aspects of art that may be related to aspects of the present disclosure, which are described and/or claimed below. This discussion is believed to be helpful in providing the reader with background information to facilitate a better understanding of the various aspects of the present disclosure. Accordingly, it may be understood that these statements are to be read in this light, and not as admissions of prior art.

Semiconductor-based devices have been frequently used to implement electronic devices, such as diodes and transistors. One class of semiconductor devices is the class of metal-oxide-semiconductor field-effect transistors (MOSFETs). MOSFETs are frequently used in electronic devices due to the relatively small currents used to control the transistor (e.g., low gate currents). MOSFET devices may be further be classified between power transistors or power MOSFETs, which are commonly built in a vertical arrangement and can be used to provide switching functionality in circuitry that operates with large currents and/or voltages, and logic transistors or logic MOSFETs, which are usually found in fast switching logic circuitry and may employ relatively small voltages (e.g., gate-source voltages). Due to differences in the voltage levels of vertical power MOSFETs and logic MOSFETs, there are substantial challenges to produce integrated devices that share a common semiconductor die without crosstalk.

BRIEF DESCRIPTION

Certain embodiments commensurate in scope with the originally claimed invention are summarized below. These embodiments are not intended to limit the scope of the claimed invention and are intended only to provide a brief summary of possible forms of the invention. Indeed, the invention may encompass a variety of forms that may be similar to or different from the embodiments set forth below.

A first embodiment that includes a semiconductor die with at least two integrated transistor devices is disclosed. At least one transistor device in the semiconductor die may be a vertical transistor having a drain terminal disposed in the bottom of the semiconductor die and gate and source terminals disposed in the top of the semiconductor die. At least one transistor device in the semiconductor die may be a horizontal transistor having drain, gate, and source terminals in the top of the semiconductor die.

A second embodiment may include an electronic device that includes an integrated circuit (IC) die that may have at least two metal-oxide-semiconductor field-electric transistor (MOSFET) devices. One MOSFET device may have a drain terminal disposed in a first surface. The source terminal and gate terminals of the first MOSFET may be disposed in an opposite surface of the IC die. The second MOSFET device may have the gate terminal, the source terminal, and the drain terminals in the opposite surface of the IC die.

A third embodiment described herein relates to a method for manufacturing. The method may include a first process to form a first MOSFET in a semiconductor die. The formation of the first MOSFET may include the application of a high-energy implant process in a first portion of an epitaxial layer of the semiconductor die. The first portion of the epitaxial layer may be a drift region of the first MOSFET. The method may include a second process to form a second MOSFET in the semiconductor die. The formation of the second MOSFET may include the formation of a blocking implant above a second portion of the epitaxial layer of the semiconductor die and a formation of a channel well above the blocking implant. The channel well may be a P well or an N well configured to include the channel of the second MOSFET.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
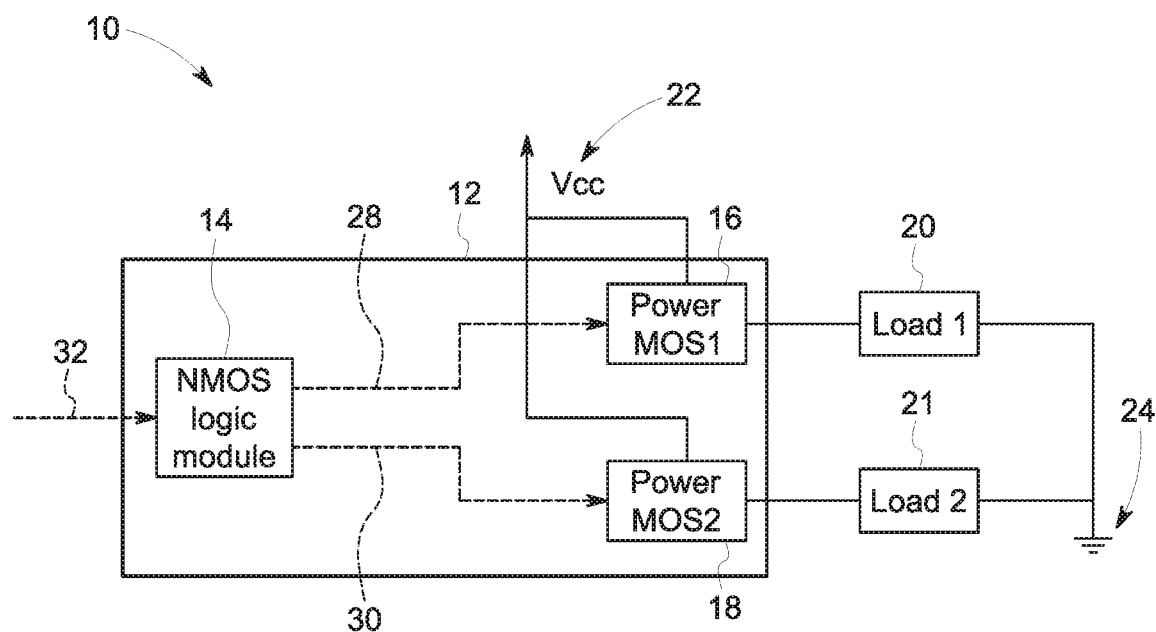
FIG. 1 is a schematic diagram illustrating an embodiment of an integrated semiconductor die that may have vertical metal-oxide-semiconductor field-electric transistor (MOSFET) devices and lateral MOSFET devices.

One or more specific embodiments of the present subject matter will be described below. In an effort to provide a concise description of these embodiments, certain features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present invention, the articles "a," "an," "the," and "said" are intended to mean that there are one or more of the elements. The terms "comprising," "including," and "having" are intended to be inclusive and mean that there may be additional elements other than the listed elements. The application may make reference to certain electrical measurement metrics. As such, it should be understood that "W" may refer to watts, "J" may refer to joules, "A" may refer to amperes, and "V" may refer to volts.

Many electrical and electronic systems may employ transistor devices to perform certain functionalities. Transistors are semiconductor devices that may have, at least, a gate terminal, a source terminal, and a drain terminal, and in which the resistance between the drain and the source may be controlled by a difference of voltage between the gate and the source. As a result, transistors can be used to implement, among other things, amplifiers, switches, and/or logic gates for a wide range of applications, including power control, digital signal processing circuitry, microprocessors, and logical circuitry, networking systems, radiofrequency (RF) systems.

Transistors may be implemented using semiconductor technology. One class of transistors is the class of metal-oxide-semiconductor field effect transistor (MOSFET) devices. MOSFETs are transistors that may include an insulation layer (e.g., oxide layer) that decreases the amount of current in the gate terminal. MOSFETs may be implemented in silicon and/or silicon carbide (e.g., SiC, 4HSiC). Certain MOSFET devices may be produced in a vertical arrangement, in which one of the terminals (e.g., the drain terminal) is disposed in a surface of the die that is opposite from the gate terminal. Vertical devices may be more suitable for power circuitry applications. For example, vertical MOSFETs may be designed to support relatively large voltages (e.g., more than 10V, more than 100V, more than 500V, more than 1000V, up to 2000V, up to 2500V, up to 3000V) between drain and source, and may be capable of dissipating large amounts of power resulting from the relatively large voltages and currents (e.g., over 1 A, over 5 A, over 10 A, over 20 A). To that end, these devices may have large breakdown voltage specifications to support the relatively large drain source voltage (VDS) for power circuitry applications.

Certain MOSFET devices may be produced in a lateral orientation, in which all the terminals are disposed in the same surface of the die. In some embodiments, the lateral MOSFET device may be have reduced breakdown voltages and, as a result may have reduced drain-source resistance in the on state (RDSON), lower activation gate source voltage (VGS), and/or faster switching which may facilitate their use with digital logic circuitry. For example, n-channel transistors (e.g., n-channel MOSFETs, NMOS transistors), are commonly found in logic gates. In general, operations with the vertical MOSFET device (e.g., MOSFET becoming conductive), may interfere the activity of adjacent semiconductor devices that may share a drift region. Moreover, due to the differences in the breakdown voltages between the MOSFETs in power applications and in logic applications, the integration of the devices with a common drift region with uniform doping may be significant. As a result, integration of lateral and vertical devices in a common die or chip is challenging.

Embodiments presented herein include integrated semiconductor dies having vertical MOSFETs adjacent to lateral semiconductor devices. The lateral semiconductor devices, in some embodiments, may be lateral MOSFETs. The adjacent lateral and vertical MOSFET devices may have substantially different breakdown voltages (e.g., more than 10 times of difference, more than 100 times of difference), which may allow integration of power MOSFETs (e.g., high voltage, and/or high current) and low power MOSFETs (low power, low current, and/or logic gate applications). In some embodiments, the vertical MOSFET devices (e.g., vertical channel devices) may be power MOSFETs and the lateral transistor devices may be logic MOSFETS, and/or high sensitivity low current amplifiers. The integrated die may employ a common epitaxial layer for the vertical MOSFET and the lateral MOSFET. To that end, the regions of the epitaxial layer having the vertical MOSFET may have a different implantation from the regions of the epitaxial layer adjacent to the lateral devices. To that end, high-energy N implantation may be used to fully implant the epitaxial layer to adjust the breakdown voltage of the vertical device. In some embodiments, localized high-energy implants (e.g., high-energy implants) in the drift region (e.g., an N-region) under the P-well regions of the MOSFET may be used to adjust the breakdown voltage of the vertical device. The isolation between the lateral and the vertical devices may be further enhanced by using an elongated well above the drift region, which may be grounded. The combination of the vertical and the lateral device may allow the integrated die to be packaged in a compact device with combined logic/power, high voltage/low voltage, or digital/analog applications.

With the foregoing in mind, FIG. 1 illustrates an electronic system 10 that may employ an integrated die 12, such as the ones described herein. Die 12 may include an NMOS logic module 13 that may have one or more lateral MOSFETs 14. Die 12 may also include the vertical MOSFETs 16 and 18. The lateral MOSFETs 14 may be N-channel MOSFETs, as illustrated in FIG. 1, or may be a P-channel MOSFET. In the electronic system 10, the integrated die 12 may be used to drive loads 20 and 21. The vertical MOSFET 16 may drive load 20 and the vertical MOSFET 18 may drive load 21. The voltage that powers loads 20 and 21 may be provided by the circuit which includes VCC supply 22 and ground 24. As such, vertical MOSFETs 16 and 18 may have a breakdown voltage large than the difference between VCC supply 22 and ground 24.

Vertical MOSFETs 16 and 18 may be driven by the NMOS logic module 13. For example, the NMOS logic module 13 may control the power MOSFETS 16 and 18 using the control signals 28 and 30. Control signals 28 and 30 may be generated from an input signal 32 that may be processed in the NMOS logic module 13. In some embodiments, control signals 28 and 30 may affect the gate-source voltage VGS of the power MOSFETS 16 and 18, respectively, and cause the transistors to turn or off. The logic processing performed by the NMOS logic module 13 may be implemented by using logic gates (e.g., AND gate, OR gate, NOT gate, NOR gate) and each gate may be associated with one or more lateral MOSFETs 14. The control signals 28 and 30 that may connect the NMOS logic module 13 to the vertical MOSFETs 16 and 18 may be a trace within the die 12 or an external wire coupling two external connectors (e.g., pins) of the die 12. The integration of the logic MOSFETs 14 and the power MOSFETs 16 and 18 in the same die may allow for more compact, integrated analog/digital or power/logic systems, with less parts and a potentially simpler system design.

Figure 2:
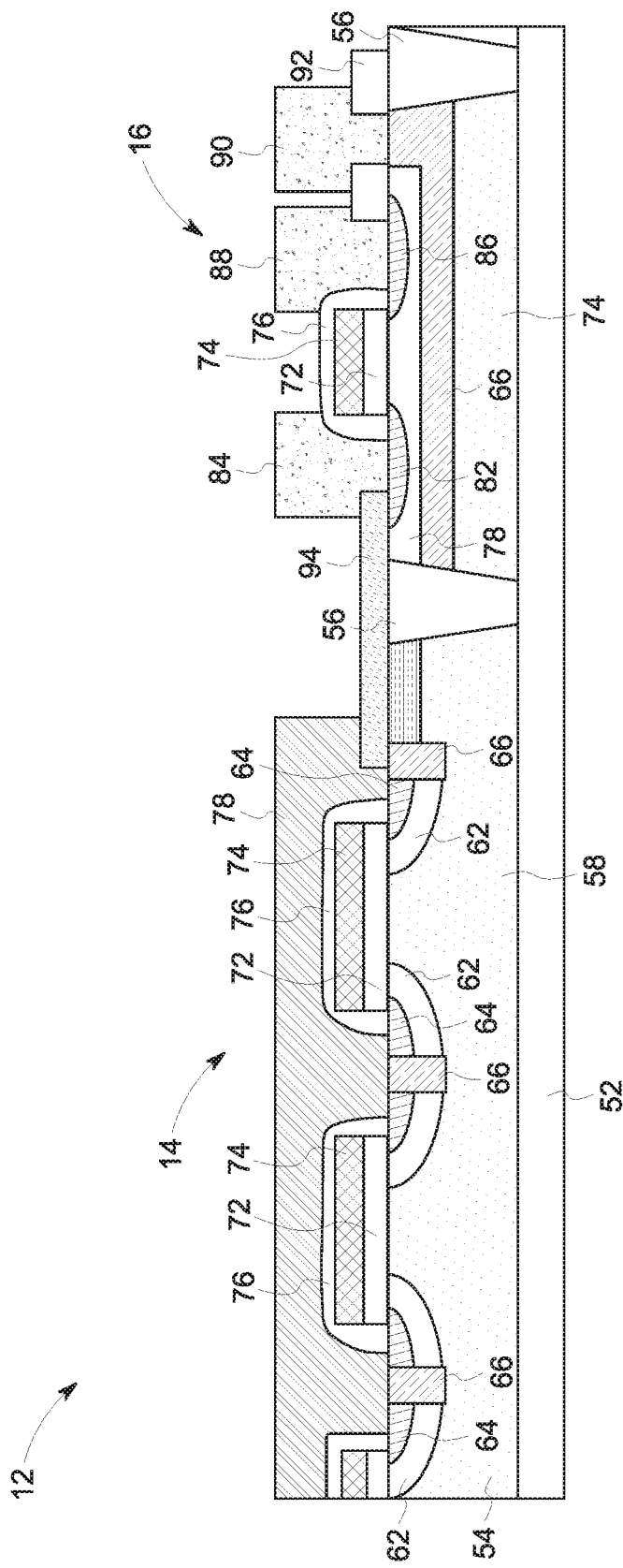
FIG. 2 is a diagram of a semiconductor die having a vertical MOSFET adjacent to a lateral n-channel metal oxide semiconductor (NMOS) transistor with, in accordance with an embodiment.

With the foregoing in mind, FIG. 2 illustrates a die 12 that includes both a vertical MOSFET 16 and a lateral MOSFET 14. As illustrated, the die 12 may include an N+ substrate 52, which may be coupled to the drain terminal of the vertical MOSFET 16. The die 12 may include an epitaxial layer formed by the N region 54 and the N region 58. The N region 54 may be a drift region for the vertical MOSFET 16, and the N region 58 may be adjacent to the lateral MOSFET 14. The N regions 54 and 58 may be doped in different levels such that the breakdown voltage across the N region 54 is different from that of N region 58. As discussed above, the breakdown voltage in the vertical MOSFET 16 may be smaller than that of the lateral MOSFET 14. To that end, the full epitaxial layer of the N region 54 and of the N region 58 may be implanted using a high-energy N implantation process. A masking process may be used to implant the N regions 54 and 58 to different levels, as detailed below.

In some embodiments, insulating structure 56 may be used to separate the N regions 54 and 58. The insulation structure 56 may be formed using, for example, a MESA sidewall, a sloped sidewall, a shallow trench insulation (STI), or any other structure that separates the N region 54 of the vertical MOSFET 16 from the N region 58 of the lateral MOSFET 14. In some embodiments, the separation may be used employing a junction termination extension (JTE) 59. Both the above-described different levels of implantation in the epitaxial layer, as well as the physical separation from insulation structures 56 may allow the lateral MOSFET 14 to perform independently from the vertical MOSFET 16. The presence of the JTE 59 and of the separation metallization 60 may improve the above-described insulation.

The vertical MOSFET 16 may have source regions that, each, includes a P well 62, an N region 64 and a P+ implant 66. The vertical MOSFET 16 may also include gate regions formed, each, by a gate oxide region 72, a polysilicon region 74, and a gate metallization 76. The gate regions may be surrounded by the source metallization 78. As discussed above, the drain terminal for the vertical MOSFET 16 may be coupled to the N+ substrate 52. The lateral MOSFET 14 may include gate regions formed by a gate oxide region 72, a polysilicon region 74, and a gate metallization 76. The gate regions of the vertical MOSFET 16 and the lateral MOSFET 14 may be similarly arranged.

The gate region of the lateral MOSFET 14 may control the channel in the P well 81, which may connect a source region and a drain region of the MOSFET 14. The source region of the lateral logic MOSFET 14 include a source N+ well 82 coupled to a source metallization 84. The drain region of the lateral logic MOSFET 14 may include an N+ well 86 and a source metallization 88. The P well 81 may be separated from the N region 58 by a P+ blocking implant 89. The P+ blocking implant 89 may prevent interference from any effects of large voltages or current flows in the N+ substrate 52 from affecting the lateral MOSFET 14. In some embodiments, a ground metallization 90 may be connected to the P+ blocking implant 89. The ground terminal formed by the ground metallization 90 may enhance the protective effect by providing an electron source for charge carriers that may be polarized (e.g., polarization of charge carries in the N region 58) during the operation of the vertical MOSFET 16.

Figure 3:
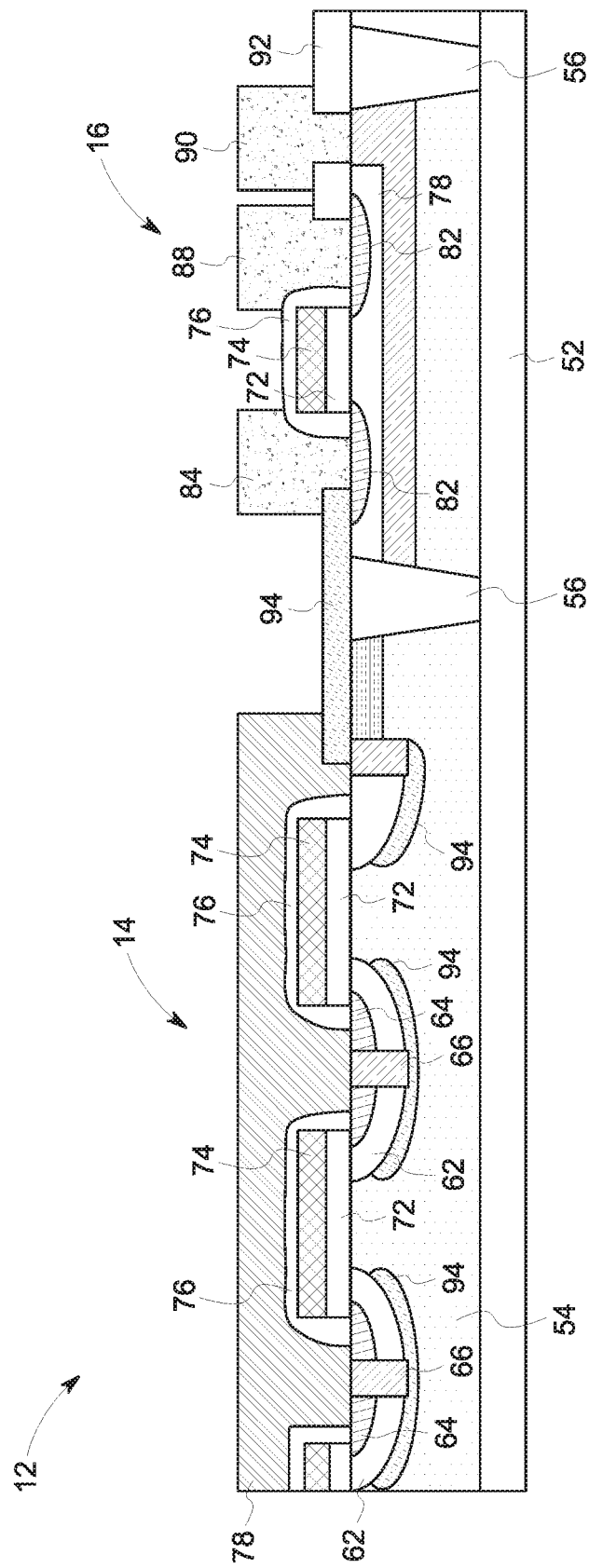
FIG. 3 is a diagram of a semiconductor die having a vertical MOSFET with n-channel implants, and adjacent to a lateral n-channel metal-oxide-semiconductor (NMOS) transistor, in accordance with an embodiment.

FIG. 3 illustrates another embodiment for an integrated die 12 that includes both a vertical MOSFET 16 and a logic MOSFET 14. As illustrated in FIG. 2, the die 12 in FIG. 3 may include an N+ substrate 52, which may be coupled to the drain terminal of the vertical MOSFET 16. The vertical MOSFET 16 may, further, have source regions that, each, includes a P well 62, a N region 64 and a P+ implant 66, which may be coupled to source metallization 78. The power MOSFET 16 may also include gate regions formed, each, by a gate oxide region 72, a polysilicon region 74, and a gate metallization 76. The gate regions may be surrounded by the source metallization 78.

In the vertical MOSFET 16 of FIG. 3, N− implants 94 may be placed under the P wells 62. The implants 94 may be placed using a high-energy full implantation into the N region 96. In this embodiment, the implantation is localized to the regions of the implants 94, to provide the above-discussed reduction in the breakdown voltage for the vertical MOSFET 16. The use of the SiC semiconductor (e.g., 4HSiC) may allow for a large breakdown voltage along the implants 94, reducing the relative voltage difference between the N region 96 in the vertical power MOSFET 16 and the N region 98 in the logic MOSFET 14. As such, the epitaxial layer of the device in FIG. 3, which includes the N regions 96 and 98, may have similar doping levels. An insulation layer 56 (e.g., a MESA sidewall, a sloped sidewall, a shallow trench insulations (STI)), or a junction termination extension may be used to separate the N region 96 of the vertical MOSFET 16 and N region 98 of the lateral MOSFET 14.

The lateral MOSFET 14 in FIG. 3 may include gate regions formed by a gate oxide region 72, a polysilicon region 74, and a gate metallization 76. The gate regions of the vertical MOSFET 16 and the lateral MOSFET 14 may be similarly arranged. The gate region of the lateral MOSFET 14 may control the channel in the P well 81, which may connect a source region and a drain region of the lateral MOSFET 14. The source region of the lateral MOSFET 14 includes a source N+ well 82 coupled to a source metallization 84. The drain region of the lateral MOSFET 14 may include an N+ well 86 and a source metallization 88. The P well 81 may be separated from the N region 58 by a P+ blocking implant 89. The P+ blocking implant 89 may prevent interference of large voltages between the N+ substrate 52 and the logic MOSFET 14. In some embodiments, a ground metallization 90 may be connected to the P+ blocking implant 89 to enhance the protective effect.

While in the above descriptions the vertical MOSFET (e.g., MOSFET 16) is adjacent to a lateral MOSFET (e.g., MOSFET 14), the insulation provided by the differential implantation energies (e.g., difference between N regions 54 and 58), and/or the presence of the grounded blocking implant (e.g., P+ blocking implant 89) may be used with other lateral devices. Accordingly, certain embodiments of this application include integrated dies with vertical MOSFETs adjacent to other lateral devices, such as diodes, lateral junction gate field-effect transistors (JFETs), lateral bipolar junction transistors (BJT), and/or other devices.

As discussed above, certain embodiments may have different doping levels (e.g., implantation levels) in different regions of the epitaxial layer of the semiconductor die. This arrangement may be achieved by employing high-energy ion implantation, to reach the entire extent of the semiconductor die. The use of silicon carbide substrate, as discussed herein, may facilitate the construction of certain embodiments. Silicon carbide-based epitaxial layers are capable of tolerating substantially high energies (e.g., 1 MeV-10 Mev) that may be associated with the thickness of the epitaxial layer for vertical MOSFETs (e.g., 500 nm-5 μm. As detailed in FIG. 4, the use of high-energy methods along with masking may allow the formation of epitaxial layers with different doping levels, as discussed in FIG. 2. It should be understood that the methods may also be applied in the construction of silicon-based integrated vertical and lateral devices. As silicon may tolerate lower ion implantation at lower energy levels (e.g., <100 keV), the silicon based devices may be have smaller vertical MOSFETs (e.g., <1 μm). Moreover, it should be understood that the descriptions above, in which the breakdown voltage of the lateral MOSFET may be smaller than that of the vertical MOSFET, may relate to the avalanche-activated semiconductor design. In embodiments in which a punch-thru design is employed, the epitaxial layer adjacent to the lateral device may be implanted.

Figure 4:
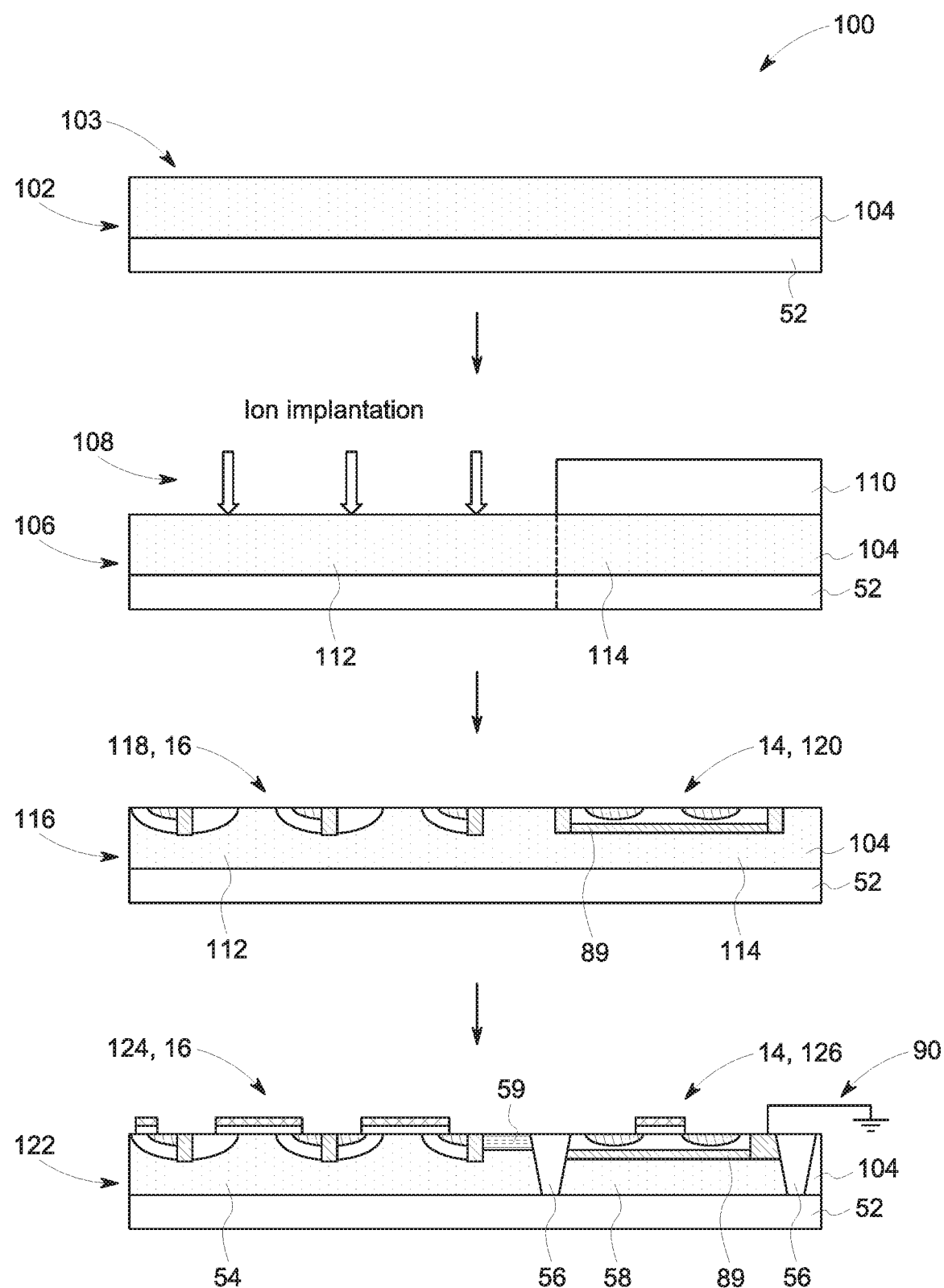
FIG. 4 is a method for construction of the integrated semiconductor device having a power MOSFET and a logic MOSFET, in accordance with an embodiment.

With the foregoing in mind, FIG. 4 illustrates a method 100 to produce an integrated semiconductor die having a vertical MOSFET and a lateral MOSFET, such as the ones described above. The methods may include a process 102, in which a semiconductor die 103 may be obtained. The semiconductor die 103 may include a substrate 52 and an epitaxial layer 104. The epitaxial layer may be produced with a doping level that may be the smallest doping level in the final device. For example, in the device of FIG. 2, the doping level of the epitaxial layer 104 may be similar to that of N region 58. In some embodiments, the doping level of the epitaxial layer 104 may be smaller than the final doping layer.

In a process 106, an ion implantation process may take place. The ion implantation may be a high-energy ion implantation 108 that is capable of implanting the full epitaxial layer. In silicon carbide embodiments, the high-energy implantation may be in a range of 1 MeV-10 MeV and in silicon embodiments, the high-energy implantation may be in a range of 1-100 keV. As discussed herein, the high-energy implantation may relate to ion implantation methods in which the energy is sufficient to fully implant the epitaxial layer. During the high-energy implantation process, a mask 110 may be used. The use of the mask 110 during the implantation 108 may allow different levels of doping between the regions 112 and 114 of the epitaxial layer 104.

In a process 116, the low depth implants 118 of the vertical device 16, and the low depth implants 120 of the lateral device 14 may be implanted. As discussed above, the blocking implant 89 may be placed between the region 114 of the epitaxial layer and the low depth implants 120, to further isolate the lateral device 14 from the vertical device 16. In a process 122, other insulation features, including the insulating structure 56 and the JTE 59 may be added. In the illustrated example, the gate metal oxide and the polysilicon features 124 and 126 that form the gate terminal may be added. Following process 122, metallization may be added to the form the gate, source, drain terminals, as well as to form the ground metallization 90 for grounding of the blocking implant 89.

The embodiments described herein may be used to allow the manufacturing of integrated power and logic devices. These integrated devices may allow a reduction in the number of parts employed in the assembly of electronic devices, which may decrease the cost of production, design, and assembly. Moreover, the use of a vertical power device with a lateral logic device may allow reduced horizontal dimensions for the device. The use of silicon carbide substrate in the construction of these devices may allow reduction of vertical dimensions in the device as the high-energy implant methods describe herein may allow high breakdown voltages along the vertical channel.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A semiconductor die, comprising:
a vertical transistor comprising a first drain terminal disposed along a bottom of the semiconductor die, a first gate terminal comprising a gate terminal disposed along a top of the semiconductor die, and a first source terminal disposed along the top of the semiconductor die; and
a lateral transistor comprising a second drain terminal, a second source terminal, and a second gate terminal disposed along the top of the semiconductor die, wherein a first breakdown voltage of the vertical transistor is substantially larger than a second breakdown voltage of the lateral transistor, and the first breakdown voltage is larger than 500V.

2. The semiconductor die of claim 1, wherein the first breakdown voltage is at least 10 times larger than the second breakdown voltage.

3. The semiconductor die of claim 1, wherein the second breakdown voltage is 20V.

4. The semiconductor die of claim 1, wherein the vertical transistor comprises a drift region fully implanted with a high-energy implant process.

5. The semiconductor die of claim 4, wherein the vertical transistor comprises a source region comprising a first well, and wherein the drift region comprises a localized high energy implant adjacent to the first well.

6. The semiconductor die of claim 5, wherein the first well comprises a P well and the high-energy implant comprises an N-implant.

7. The semiconductor die of claim 1, wherein the lateral transistor comprises a blocking implant coupled to a ground terminal of the lateral transistor.

8. The semiconductor die of claim 7, wherein the lateral transistor comprises an N-channel type transistor, and wherein the blocking implant comprises a P+ blocking implant.

9. An electronic device comprising:
an integrated circuit (IC) die that comprises:
a first metal-oxide-semiconductor field-electric transistor (MOSFET) comprising:
a first drain terminal disposed in a first surface of the IC die,
a first gate and a first source terminal disposed in a second surface of the IC die opposite to the first surface of the IC die, and
a first drift region comprising high energy N-implants; and
a second MOSFET comprising a second drain terminal, a second source terminal, and a second gate terminal disposed in the second surface of the IC die.

10. The electronic device of claim 9, wherein the first MOSFET comprises a first breakdown voltage larger than 500V and the second MOSFET comprises a second breakdown voltage smaller than 100V.

11. The electronic device of claim 9, wherein the second MOSFET comprises a blocking implant disposed between a drift region of the IC die and a channel well of the second MOSFET.

12. The electronic device of claim 9, comprising a logic circuit that comprises the second MOSFET.

13. The electronic device of claim 12, wherein the logic circuit is configured to control the first MOSFET.

14. The electronic device of claim 13, wherein the first MOSFET is configured to provide a current to a load of the electronic device.

15. A method to manufacture, comprising:
applying to a first mask to a semiconductor die that comprises a epitaxial layer that comprises a first portion associated with a vertical metal-oxide-semiconductor field-effect transistor (MOSFET) and a second portion associated with a lateral MOSFET, wherein the mask is disposed above the second portion of the epitaxial layer;

applying a high-energy ion implant in the masked semiconductor die to implant the first portion of the epitaxial layer;

forming a blocking implant in the second portion of the epitaxial layer; and forming a channel well of the lateral MOSFET above the blocking implant.

16. The method of claim 15, comprising forming a ground connection coupled to the blocking implant.

17. A semiconductor die, comprising:

a vertical transistor comprising a first drain terminal disposed along a bottom of the semiconductor die, a first gate terminal comprising a gate terminal disposed along a top of the semiconductor die, and a first source terminal disposed along the top of the semiconductor die; and a lateral transistor comprising a second drain terminal, a second source terminal, and a second gate terminal disposed along the top of the semiconductor die, wherein the lateral transistor comprises a blocking implant coupled to a ground terminal of the lateral transistor.

18. The semiconductor die of claim 17, wherein the lateral transistor comprises an N-channel type transistor, and wherein the blocking implant comprises a P+ blocking implant.

19. The semiconductor die of claim 17, wherein a first breakdown voltage of the vertical transistor is larger than 500V and a second breakdown voltage of the lateral transistor is smaller than 100V.

20. The semiconductor die of claim 17, wherein the first vertical transistor comprises a drift region having high energy N-implants.

* * * * *